United States Patent [19]

Resler

[11] Patent Number: 4,853,626

[45] Date of Patent: Aug. 1, 1989

[54] EMULATOR PROBE ASSEMBLY FOR PROGRAMMABLE LOGIC DEVICES

[75] Inventor: Edwin W. Resler, San Jose, Calif.

[73] Assignee: Xilinx, Inc., San Jose, Calif.

[21] Appl. No.: 165,212

[22] Filed: Mar. 8, 1988

Related U.S. Application Data

[63] Continuation-in-part of Ser. No. 24,226, Mar. 10, 1987, abandoned.

[51] Int. Cl.⁴ .................. G01R 31/02; G01R 31/26
[52] U.S. Cl. ........................ 324/158 F; 324/73 R; 324/158 R
[58] Field of Search ............ 324/158 F, 158 P, 73 PC, 324/73 R, 73 AT; 371/25, 20, 16, 15; 439/290, 291, 284, 65, 638, 640

[56] References Cited

U.S. PATENT DOCUMENTS

| | | | |
|---|---|---|---|
| 4,042,878 | 8/1977 | Peterson et al. | 324/158 F X |
| 4,176,780 | 12/1979 | Sacher et al. | 324/73 R X |
| 4,334,308 | 6/1982 | Thinschmidt et al. | 324/73 R |
| 4,339,819 | 7/1982 | Jacobson | 324/73 R X |
| 4,405,735 | 8/1977 | Worcester et al. | 324/158 F X |
| 4,527,234 | 7/1985 | Bellay | 324/73 R |
| 4,544,882 | 10/1985 | Flora | 324/73 R X |

OTHER PUBLICATIONS

Emulation Technology, Inc.-1987 Product Catalog.
Emulation Technology, Inc.-State-of-the-Art VLSI & Surface Mount Accessories-1988.

Primary Examiner—Reinhard J. Eisenzopf
Assistant Examiner—Vinh P. Nguyen
Attorney, Agent, or Firm—Skjerven, Morrill, MacPherson, Franklin & Friel

[57] ABSTRACT

An emulator probe assembly for testing circuit boards which control programmable logic devices includes a header assembly, a universal pod, and an extender. The header assembly includes a socket, a plug, and a flexible cable. The header socket is matched in size to the socket of the circuit board so that during testing the programmable logic device can be inserted into the header socket and the header plug into the circuit board. Some pins in the header plug are connected directly to crresponding pins in the header socket. However other pins in the header plug are connected through lines in the flexible cable to contacts in a pod plug at the opposite end of the flexible cable. Corresponding pins in the header socket are also connected through the flexible cable to contacts in the pod plug. The pod plug is received by the universal pod which has electronics for controlling or receiving signals from the programmable logic device or the circuit board. An emulator can control this universal pod to in turn control the programmable logic device and otherwise assist a designer in testing the circuit board. The extender includes test pins for applying test signals to or monitoring signals for individual pins of the programmable logic device. The extender includes removable shunts or jumpers for disconnecting certain pins in the programmable logic device from corresponding pins in the circuit board.

12 Claims, 7 Drawing Sheets

EMULATOR PROBE ASSEMBLY FOR PROGRAMMABLE LOGIC DEVICES

This is a continuation-in-part of application Ser. No. 07/024,226 filed Mar. 10, 1987.

BACKGROUND OF THE INVENTION

1. Field of the Invention

This invention relates to an emulator probe assembly that couples an emulator system to an electrical circuit network under development, and in particular an emulator probe assembly that is useful with a system under development that incorporates a programmable logic device.

2. Description of the Prior Art

When a product is being designed or a designed product is being tested, special equipment is generally employed to determine that the product will perform as intended. The equipment employed depends upon the product and the kind of testing to be performed. One prior art system for testing wiring on a printed circuit board taught by Trousdale et al. in U.S. Pat. No. 3,549,995 issued Dec. 22, 1970 verifies the wiring of a board under test against a like master unit which has been verified as having correct wiring. (see Trousdale, col. 4, lines 46-49) Vinsani, U.S. Pat. No. 3,882,386 issued May 6, 1975 also teaches comparing a unit under test with a reference unit.

For testing more complex devices, the test equipment generally tests separate portions of the device in order to isolate the location of failure. Providing test points which give easy access to the individual pins of a device is known, and shown, for example, on pages 2-4 of the 1987 Product Catalog of Emulation Technology, Inc.; 2368B Walsh Ave., Bldg. D, Santa Clara, Calif. 95051. French patent publication No. 2,260,257 published Aug. 29, 1975 on the invention of Marcel Rehel and Jean-Claude Lepinay teaches an articulated plug board which plugs into the socket of the device to be tested and which includes switches such that individual signals from the board to the device under test can be disconnected during testing. The articulated device allows flexibility in physically locating the device under test. The 1988 catalog from Emulation Technology, ibid, also shows on page 11 such a device, not articulated. For still more complex devices, signals generated by a computer are provided to a device under test and responses from the device are compared to expected responses. U.K. Patent Application No. GB2178543A of inventors Scott and Polstra published Feb. 11, 1987 teaches a computer assisted method of isolating a fault in a circuit board. U.S. Pat. No. 4,176,780 to Sacher et al issued Dec. 4, 1979 also teaches a computer assisted method for testing printed circuit boards.

When designing an electrical circuit network which includes integrated circuit logic chips, the designer generally uses an emulator to assist in the design. Generally, emulators are used to permit a computer or data processor to perform operations which will eventually be performed by another system. Emulators generally employ hardware that enables an imitating system to accept the same data, execute the same programs and achieve the same results as the system under development while allowing more control over the imitating system than available over the system under development.

With the archival of programmable logic devices (PLDs), there is now a need for testing not only a circuit board but for testing a particular program being used by the circuit board to program a programmable logic device. For circuits using programmable logic devices, the designer uses the emulator during development and testing to provide signals to the programmable logic device which are the same as those to be provided by a circuit board in the system under development. The designer has a need to determine whether the system under development has any defects or problems.

To couple the emulator system to the system under development, emulator probe assemblies are utilized. Typically, emulator probes employ electromechanical devices that enable connection between the emulator and the system under development. The emulator probes are configured to fit into a socket of the system under development in which the integrated circuit chip device normally is inserted. Most emulator probes are relatively large and use considerable space when mounted on a circuit board. When used on densely populated boards, the emulator probe may physically interfere with adjacent components thereby limiting the number of components and the arrangement of the elements of the system under development. It is therefore desirable to have an emulator probe that uses no more space than the integrated circuit chip device that normally resides in the socket of the system under development in order that the probe may be plugged directly into the socket in which the integrated circuit chip normally resides. Also, when emulator probes are used with test equipment, attachment and proper connection between the emulator probe and the test equipment has been found to be very difficult and time-consuming. Furthermore, signal lines that are connected to the emulator probe usually are relatively long, several inches in length, for example, so that capacitive and inductive loading on the electrical circuits are increased, thereby adversely affecting high speed emulation. When the integrated circuit chip is a programmable device and the system being tested is the circuit board (or the programming of the circuit board) in which the programmable logic device resides, it is desirable to be able to locate the programmable logic device as close as possible to its resident location while testing the ability of the circuit board to properly program and function with the programmable logic device. Further, with existing probes, it has not been possible to use an actual programmable logic device during testing of the circuit board.

SUMMARY OF THE INVENTION

An object of this invention is to provide an emulator probe assembly that is relatively small, lightweight and which uses a minimal amount of circuit board space.

Another object of this invention is to provide an emulator probe assembly that can be accommodated by any socket configured for an integrated circuit chip.

Another object is to provide an emulator probe assembly that affords the use of relatively short signal lines thereby precluding the introduction of unwanted additional capacitance and inductance in the system under development.

Another object of this invention is to provide easily available test points for connection of test equipment, such as oscilloscopes or logic analyzers, for the integrated circuit chip and the system under development.

In accordance with this invention, a system under development is electrically coupled to an emulator by an emulator probe assembly. The probe assembly comprises a flexible header assembly and a universal pod (the function of which will be described later) which is connectable to and separable from the header assembly. The header assembly includes a header socket which can accommodate a standard integrated circuit chip such as a programmable logic device, a header plug which can be inserted into a circuit board socket intended for accommodating the integrated circuit chip, and a flexible cable which is connectable to the universal pod by a pod plug. During development, the programmable logic device is removed from its socket on the circuit board of the system under development. The header assembly is plugged into the socket for the programmable logic device on the circuit board. The programmable logic device is then plugged into the socket of the header assembly. A plurality of conductive lines extend directly from pins in the plug of the header assembly to corresponding contact points in the socket of the header assembly. When the programmable logic device is inserted in the socket of the header assembly and the plug of the header assembly is inserted into the socket of the circuit board, these lines electrically connect from the circuit board to the corresponding pin on the programmable logic device. However, the conductive lines in the header assembly do not directly connect all of the contact points in the plug of the header assembly directly through to corresponding contact points in the header socket. Lines from some contact points in the plug of the header assembly to corresponding contact points in the socket of the header assembly are broken. These broken lines are located at those contact points at which the emulator can provide signals to substitute for those normally provided to the programmable logic device by the circuit board, and at which the emulator can monitor signals from the circuit board and the programmable logic device. For developing a circuit board to program a programmable logic device, the lines chosen to be broken are usually those which configure the logic device. The flexible cable connects each end of these broken lines to a corresponding pin in the pod plug which plugs into the universal pod. The universal pod contains active devices which are controlled by the emulator. The universal pod can either shunt the two ends of a broken pair directly together, apply signals to either end of the broken pair or receive and respond to signals present on either end of the broken pair.

Signals on many of the lines from the programmable logic device to the circuit board are high frequency signals for which it is necessary to retain low capacitance during testing so that significant delay is not added by the test equipment. The device of this invention achieves this purpose by providing that the unbroken lines extending from the circuit board socket to the header socket are short, in one embodiment about ¼ inch.

At least two of the lines from the circuit board to the programmable logic device are Vcc and ground lines for providing power to the programmable logic device. These are direct current lines for which it is desirable to have a stable voltage level. In a typical circuit, in order to smooth the power line voltage, a capacitor is provided on the circuit board between Vcc and ground physically close to the location where power is drawn from the Vcc and ground lines. Adding the extension lines from the circuit board socket to the header assembly socket during testing moves the circuit board capacitor between the Vcc and ground lines farther from the programmable logic device which receives the power. In one embodiment of this invention, in order to further smooth the power supply voltages to the programmable logic device, a capacitor is provided in the header assembly itself between the Vcc and ground lines.

Another feature of this invention is the use of an extender which can be seated in the header assembly socket. The extender provides test points for easy test connections to the electrical circuit network under development. The extender also includes shunts or jumpers which allow testing of an integrated circuit chip while parts of the programmable logic device are isolated from the circuitry of the system under development.

The extender has a plug which fits into the socket of the header assembly where the programmable logic device may reside during testing. To use the extender during testing, the programmable logic device is removed from the socket in the header assembly, the plug of the extender is inserted into the socket of the header assembly, and the programmable logic device is then inserted into a corresponding socket of the extender. The extender may also be inserted into the circuit board without the intervening header assembly to provide test points for monitoring or controlling leads of the programmable logic device.

Like the header assembly, the extender includes a plurality of lines connecting from the plug straight through to corresponding points in the socket of the extender. And, like the header assembly, the extender may include a capacitor between Vcc and ground lines. The extender also includes lines from each of the pins in the extender socket to a test pin location at the perimeter of the extender which can easily be contacted with a test device. Also like the header assembly, the extender provides certain lines which do not connect straight through. Separate lines run from the socket and plug of the extender to a location at an accessible perimeter of the extender where a removable shunt can connect the lines from the plug and the socket together. When the shunt is removed, the signal provided on that pin from the circuit board to the programmable logic device or from the programmable logic device to the circuit board is interrupted. The signal can be viewed on an oscilloscope or can be replaced with a known signal in order to further observe performance of the programmable logic device and the circuit board.

This shunt feature is particularly useful when the programmable logic device is to be used in a configuration in which all of the pins from the programmable logic device will be used. As the circuit board is being tested for proper programming of the programmable logic device, signals on certain leads of the programmable logic device which have been configured as output ports may show that certain internal functions of the programmable logic device are being performed correctly. However other internal portions of the programmable logic device may not be performing correctly. It is then desirable to look in more detail at the operation of the incorrect portions of the programmable logic device. One or more of the pins of the programmable logic device for which shunts in the extender are provided and which have been configured as output ports may be temporarily reconfigured to provide internal signals from portions of the programmable logic device not performing correctly. Then these internal signals may be looked at individually, for example on an oscilloscope screen or in a logic analyzer, giving the designer the information needed to properly reconfigure the incorrect portions of the programmable logic device.

The device of this invention has another advantage over prior art test equipment. The device of this invention allows the circuit board to be tested while it is operating the actual logic device which will be used during operation rather than having the circuit board under test interact with a device which emulates the entire programmable logic device. Thus there is far less chance of error being introduced by an emulator not having a response identical to the programmable logic device. In the present invention, the emulator can provide signals which configure the programmable logic device while the circuit board provided the high speed input and output signals to and from the programmable logic device. Thus the test environment is much closer to the operating environment and the test results are more realistic.

Thus the header assembly, extender, universal pod, and emulator can perform a variety of operations:

(1) program a programmable logic device which will in operation be programmed by a circuit board and then allow that programmed logic device to be operated by the circuit board;

(2) shunt signals from a circuit board to the programmable logic device and monitor these signals while the circuit board is programming the logic device and interacting with the logic device;

(3) send signals to the circuit board;

(4) reprogram the programmable logic device so that internal nodes of the logic device can be monitored while disconnecting pins on which these internal signals are placed by the logic device from contact points on the circuit board which they would otherwise reach;

(5) monitor certain individual signals provided by the circuit board while preventing these signals from reaching the logic device;

(6) replace certain signals sent from the circuit board to the logic device or from the logic device to the circuit board; and (7) monitor and smooth the power supply voltage.

Thus it is clear that the device of this invention has power and flexibility in the testing and development of integrated circuit devices, especially in the testing and development of circuit boards for programming programmable logic devices.

DESCRIPTION OF THE DRAWINGS

The invention will be described in detail with reference to the drawings in which.

The same numerals refer to the same elements throughout the drawings.

DETAILED DESCRIPTION OF THE INVENTION

Figure 1:
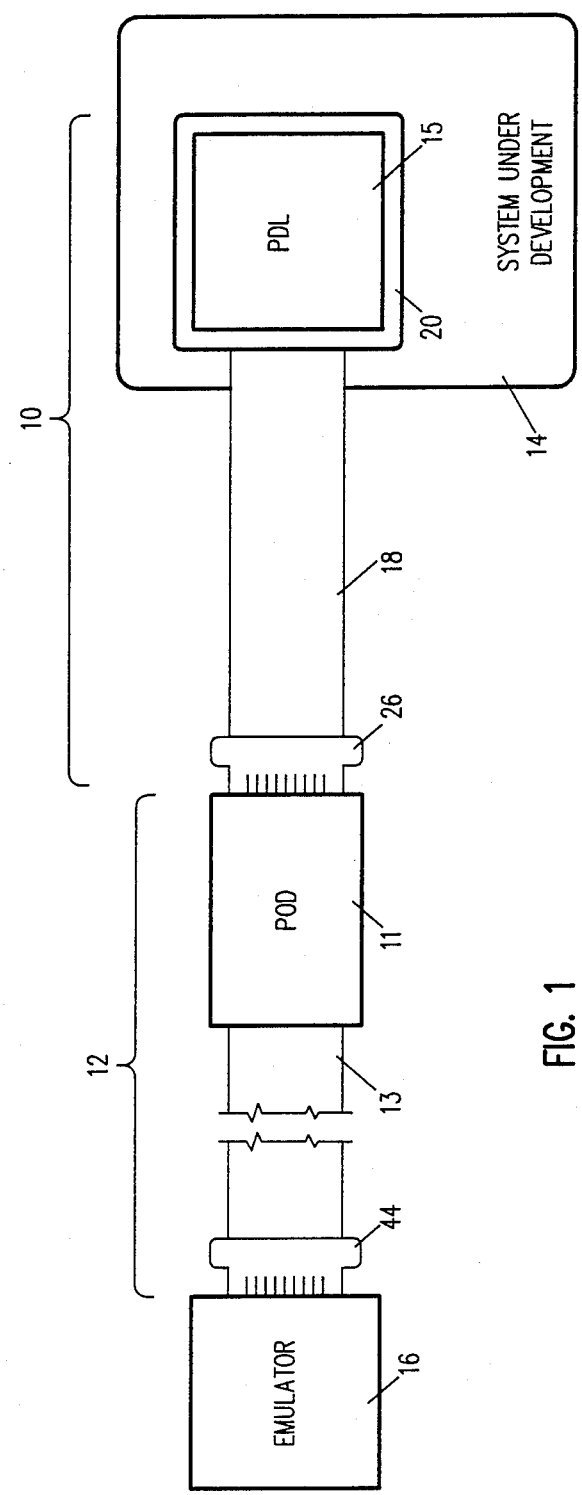
FIG. 1 is a representational top view of an emulator probe assembly, in accordance with this invention.
Figure 2:
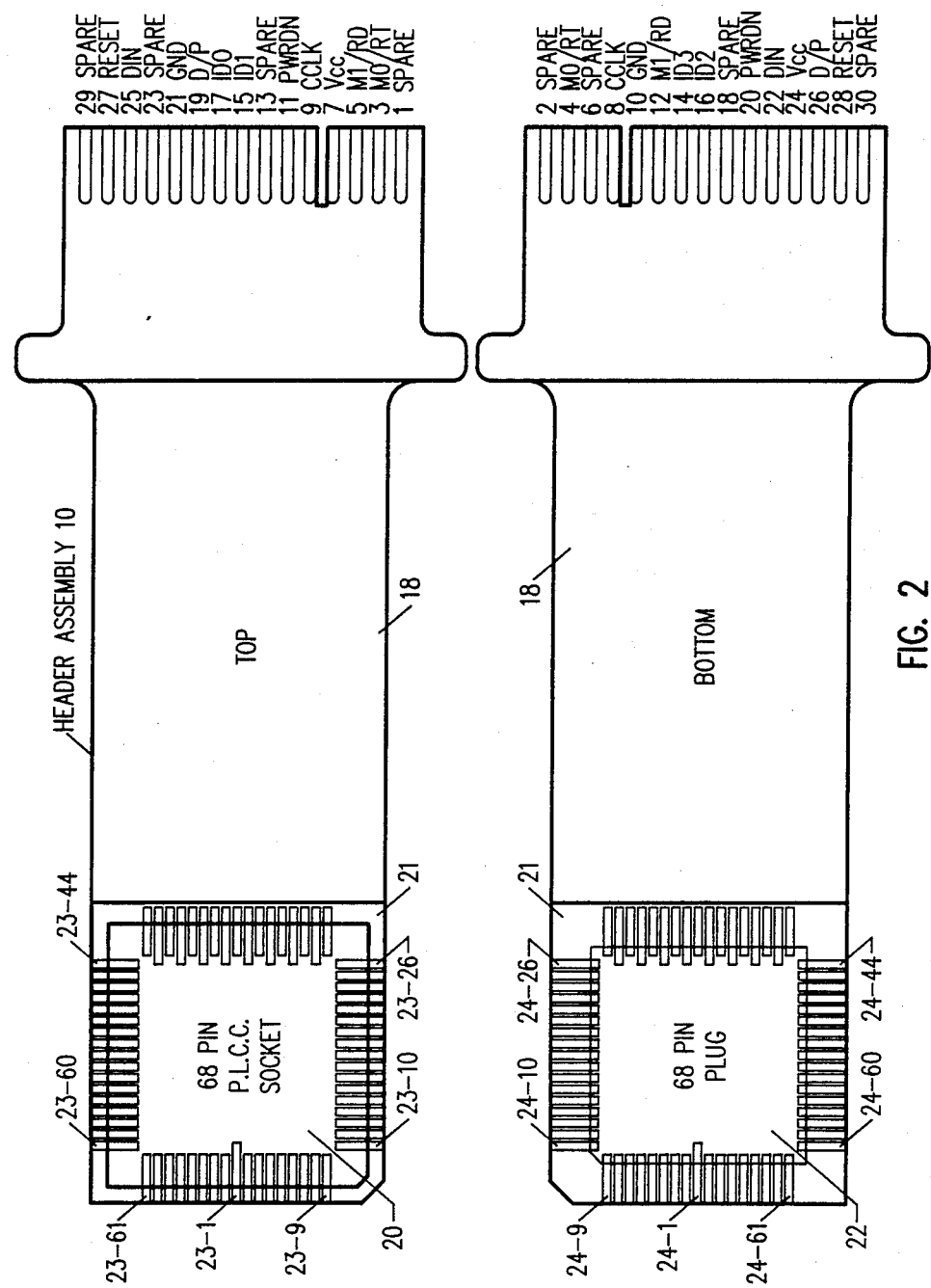
FIG. 2 shows top and bottom plan views of a header assembly portion of the emulator probe assembly of this invention.

With reference to FIG. 1, an emulator probe assembly, comprising a header assembly 10 and universal pod 12, is coupled between the socket of an electrical circuit network 14 under development and an emulator system 16. The header assembly 10 includes a header socket 20, which is attached to one end of a flexible cable 18 having signal lines such as 18-1 through 18-n shown in FIG. 5. The flexible cable carries control signals from the system under development 14 to the pod 12 and provides control signals from the pod to a programmable logic device 15. A standard pod plug 26 with electrical leads and terminals is attached to the other end of the flexible cable 18.

Figure 5:
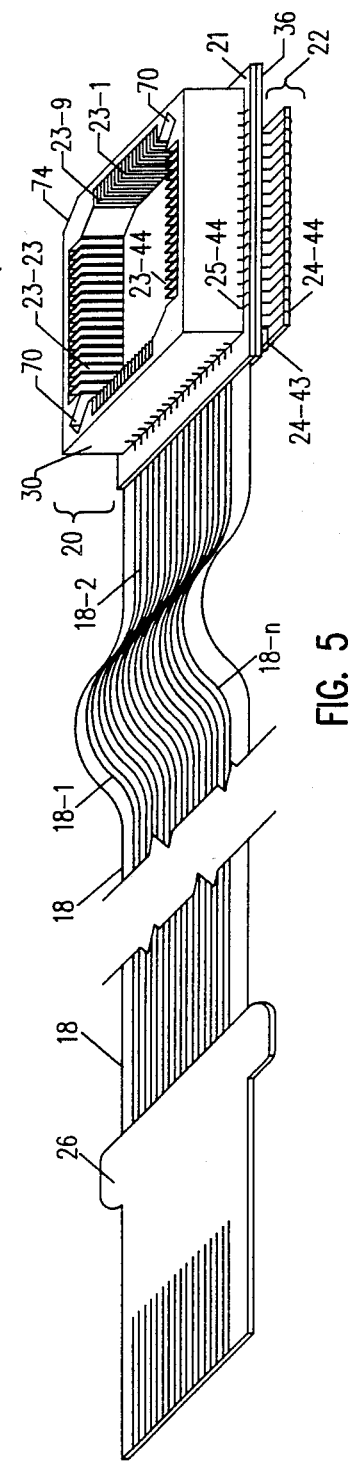
FIG. 5 is a perspective view illustrating a header assembly according to one embodiment of this invention.

As shown in FIG. 5, in one embodiment for a system using a 68-pin plastic leaded chip carrier (PLCC) programmable logic device, the header socket 20 is formed with a hardboard base 21 on which is mounted a wall enclosure 30 having slots 23-1 through 23-68 in the four inner wall surfaces and conductive leads 25-1 through 25-68 contained in the slots. The conductive leads 25-1 through 25-68 exit from the bottom of the four outer surfaces of the enclosure 30 and are aligned in a spaced arrangement on top of the hardboard base 21. Conductive lead 25-44 is labeled in FIG. 5.

The end of the flexible cable 18 is sandwiched between the hardboard 21 and a second hardboard 36 to which a plug assembly 22 is attached. The plug assembly 22 has a number of conductive leads 24-1 through 24-68 corresponding to the number of leads 25-1 through 25-68 available from the header socket 20. Many of the leads 25-1 through 25-68 of the header socket 20 and the leads of the plug assembly 22 are electrically connected through apertures formed respectively in the upper hardboard 21, lower hardboard 36 and the cable 18. However, some of the leads 25-1 through 25-68 are connected to conductive lines (see FIG. 8) in flexible cable 18 which are in turn connected to conductive lines on the surface of pod plug 26.

Figure 8:
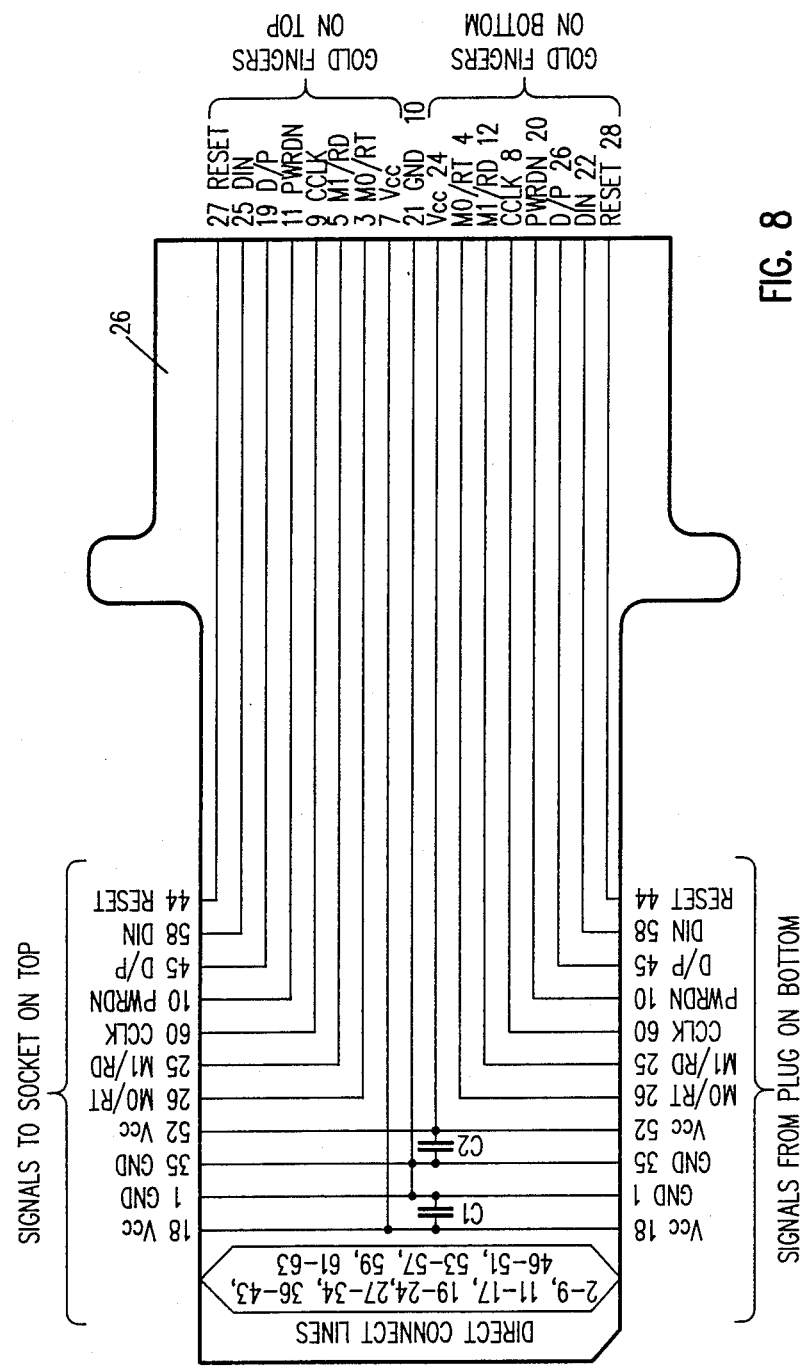
FIG. 8 is a schematic illustration of a header assembly according to one embodiment of this invention illustrating straight-through pins, connections from bottom and top sides of certain pins through the flexible cable to the pod plug, and capacitors between Vcc and ground.

FIG. 8 indicates schematically, for the 68-pin embodiment described above, that pins 2-9, 11-17, 19-24, 27-34, 36-43, 46-51, 53-57, 59, and 61-68 are directly connected from bottom plug 22 to top LCA socket 20. FIG. 8 further shows that pins 18, 1, 35, 52, 26, 25, 60, 10, 45, 58, and 44 are connected to flexible cable 18. Pins 18, 1, 35, and 52, which carry Vcc and ground signals are also connected directly through from bottom plug 22 to LCA socket 20, and that pins 26, 25, 60, 10, 45, 58, and 44 are connected to conductive lines in flexible cable 18 but not connected directly through from bottom plug 22 to LCA socket 20. Capacitors C1 and C2 are inserted between each pair of Vcc and ground lines, as shown in FIG. 8.

In a preferred embodiment, flexible cable 18 includes an upper layer of conductive leads extending from header socket 20 to pod plug 26. Every other conductive lead in this upper layer is a ground line, serving to isolate the signal lines from each other. Additionally, flexible cable 18 includes a lower layer of conductive leads extending from header socket 20 to pod plug 26 which are connected to ground and located directly beneath each of the upper signal lines. These lower ground lines further isolate the upper signal lines and provide a controlled impedance for the signal lines.

Figure 7:
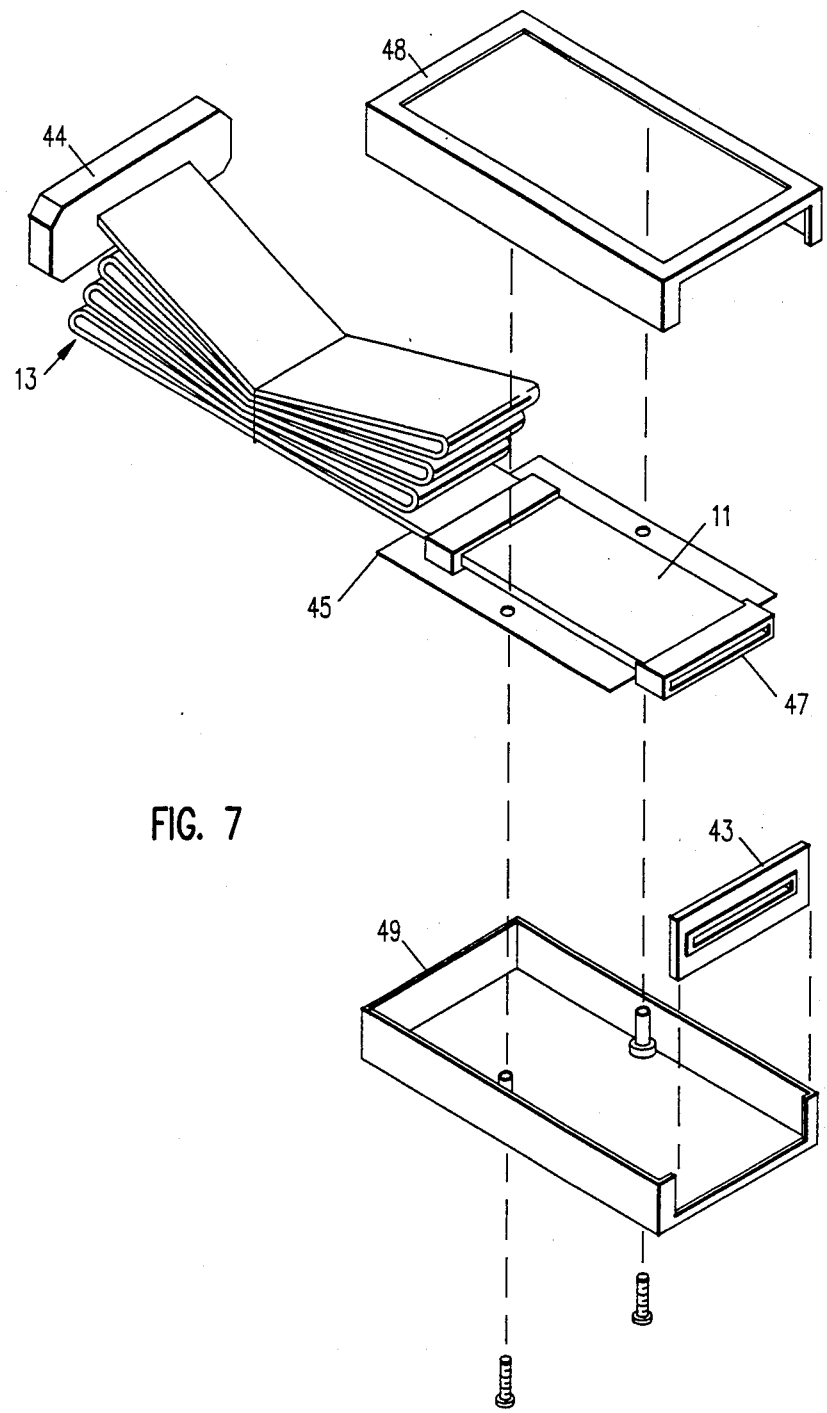
FIG. 7 is an exploded view of the universal pod assembly utilized with this invention.

At the other end of the flexible cable 18, the standard pod plug 26 is pluggable into a connector or receptacle of the universal pod 12. The universal pod 12 includes a plastic pod case (see FIG. 7) consisting of a top cover 48, bottom cover 49 and panel 43, which encloses electronics 11 for processing signals passing between the emulator system 16 and the system under development 14. The universal pod has a ribbon cable 13 with a connector 44 for engaging a receptacle of the emulator system 16. The pod electronics allows the emulator system to isolate and control a programmable logic device when desired.

One feature of this invention is the ability to separate easily the header assembly 10 from the universal pod 12, in contrast to prior art assemblies of this type wherein the header assembly and pod are fixedly joined so that the header and pod combination can accommodate only one type of programmable logic device. With the invention disclosed herein, different type header assemblies 10 for accommodating different logic devices 15 can be used for coupling the emulator system 16 to the system under development 14. The detachable header assembly avoids duplication of pod electronics 11 and allows an appropriate type of header assembly 10 to be plugged into the pod.

Since the receptacle of the header socket 20 is of the same type as the one that the header plug assembly 22 is plugged into, a programmable logic device 15 identical to the one that was inserted in the system under development 14 can be plugged into the header socket 20 for emulation. In the same vein, different universal pods 12 having different electronics and different numbers of signal lines or traces can be used between the header assembly and the emulator.

Figure 3:
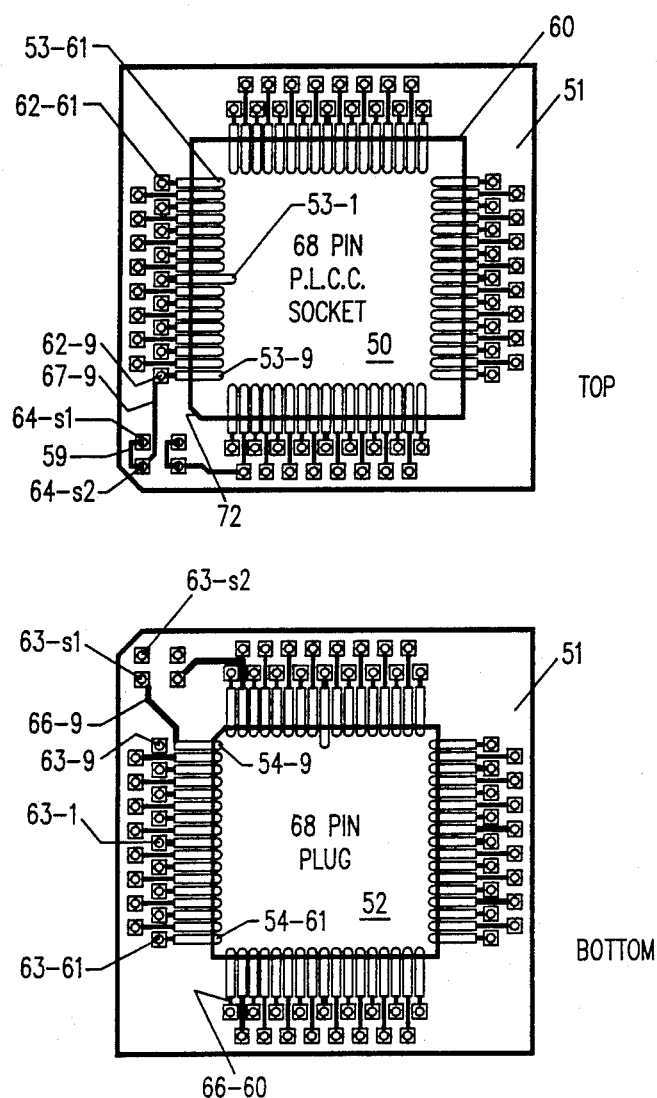
FIG. 3 shows top and bottom plan views of an extender socket element used with the emulator probe assembly of this invention.
Figure 4:
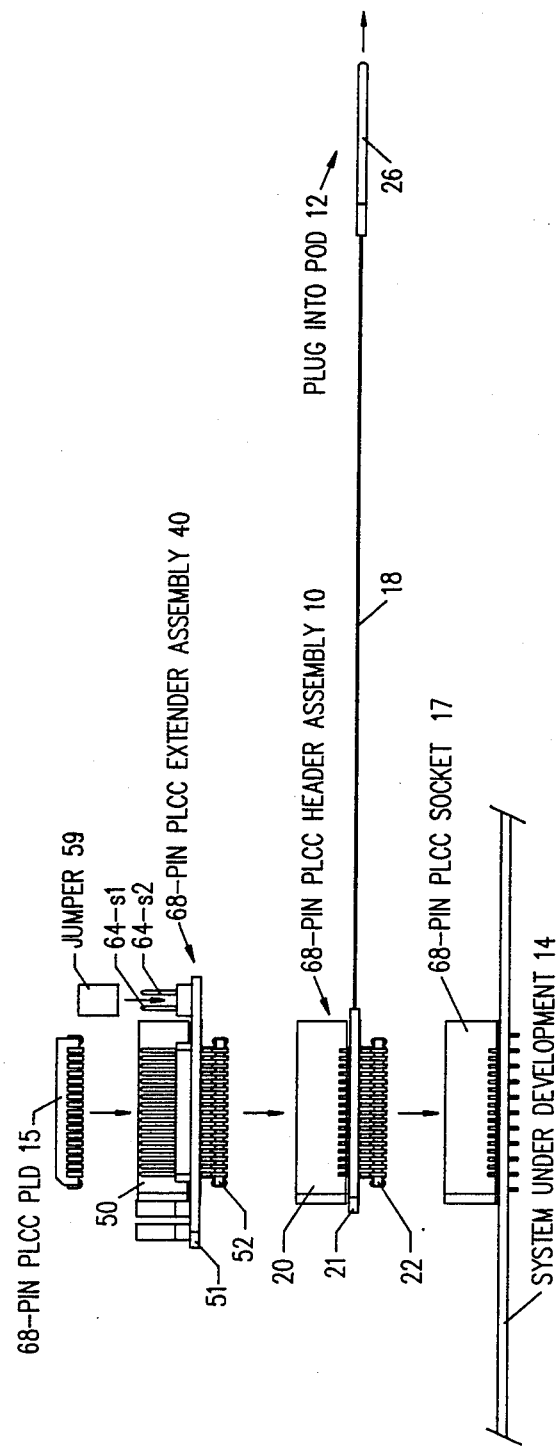
FIG. 4 is an exploded side view illustrating one relative orientation of the circuit board socket, the header assembly, the extender assembly, and the programmable logic device as used with this invention.
Figure 6:
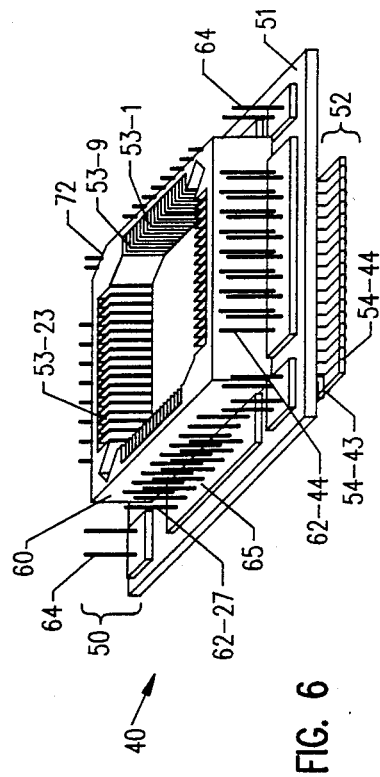
FIG. 6 is a perspective view illustrating an extender including test point pins and jumper pins.

Another feature of this invention is the provision of an extender 40, which incorporates the basic structure of the header socket 20. The structure of extender 40 is shown in side view in FIG. 4, in perspective view in FIG. 6, and in top and bottom plan views in FIG. 3. Extender 40 includes an extender socket 50, and an extender plug assembly 52. As part of extender socket 50, a wall structure 60 (see FIGS. 3 and 5) equivalent to the wall structure 30 of header socket 20 shown in FIG. 5 is joined to a hardboard 51. Around the periphery of the wall structure 60 of the extender socket 50, test point pins 62-1 through 62-68 are seated in insulator supports 65 in spaced alignment. The test point pins are connected through the insulator supports and the hardboard 51 to plug assembly 52, equivalent to header plug assembly 22. Extender plug assembly 52 can be seated in the receptacle of the header socket 20, or directly in a similar socket 17 (see FIG. 4) associated with the system under development. The test pin pins 62 allow easy connection of test instruments to the system under development for trouble shooting or verification of design. A test point is provided for each pin of the programmable logic device 15, as shown in FIG. 3.

To utilize the extender 40, the programmable logic device 15 that is seated in the header socket 20 is removed with an extraction tool that engages a pair of grooves 70 (see FIG. 5) in opposite corners of the wall 30. The extender 40 is plugged into the header socket 20 by means of the plug assembly 52. All plug elements 22, 52, and the programmable logic device 15 and all sockets 20, 50 and 17 are matched in size and pin alignment. While plugging the extender 50 into the header socket 20, chamfered corners 72 and 74 are aligned so that the pins of the two elements are properly aligned. The programmable logic device 15 is then inserted into the extender socket 50 with the pins of the logic device in alignment with the pins of the header and extender. The alignment may also be facilitated by means of an indicator provided in a wall of the enclosure 30 of the header element. By stacking the extender 40 and the programmable logic device over the header element, the larger extender 40 clears the electrical components that are wired to the circuit board, and therefore no additional board space is used.

In addition, the extender 40 includes shunt or jumper pins such as 64-51 and 64-52 disposed in the corners of the hardboard 51. The extender 40 thus provides a number of interruptable signal lines between the system under development 14 and a programmable logic device 15 to be emulated. The shunts or jumpers such as jumper 59 are removable so that a programmable logic device pin can be disconnected from the system under development to allow special debug setups. The shunts or jumpers such as jumper 59 are removed from adjacent jumper pins such as 64-51 and 64-52 to isolate selected pins of the programmable logic device from the target system under development. The shunts or jumpers allow the reconfiguration of a programmable logic device in order to bring out an internal node of the programmable logic device to an isolated pin so that the node can be probed. The shunts or jumpers are particularly useful when trouble shooting a circuit design wherein all the input/output pins are used, because they allow the designer to temporarily change the configuration of the programmable logic device.

The use of the shunts will now be described in more detail in connection with FIG. 3. As shown in FIG. 3, bottom view, most of the extender plug pins 54-1 through 54-68 located around the perimeter of plug hardboard 52 are connected directly by conductive traces 66-1 through 66-68 to solder joints 63-1 through 63-68 which are in turn connected through hardboard 51 to test pins 62-1 through 62-68. However, some of the traces do not connect to their corresponding solder joints. One preferred embodiment provides eight pins which are connected through shunts rather than directly to the solder joints. For simplicity, FIG. 3 shows only two pins connected through shunts. Extender plug pin 54-9 (see FIG. 3, bottom view) is connected by trace 66-9 not to solder joint 63-9 but to shunt solder joint 63-sl. This solder joint 63-sl in turn connects through hardboard 51 to shunt pin 64-sl (see FIG. 3, top view). Removable shunt 59 connects shunt pin 64-sl to shunt pin 64-s2 which is connected by trace 67-9 to test pin 62-9. When shunt 59 is removed, extender plug pin 54-9 does not connect the corresponding socket connection from the user's system under development 14 to the corresponding pin of programmable logic device 15. However, test pin 62-9 is connected to the corresponding pin of programmable logic device 15. Programmable logic device 15 can be temporarily reconfigured to connect test pin 62-9 to the internal node of interest in the programmable logic device so that test equipment can be connected to test pin 62-9 to access this internal node independent of signals applied by system under development 14 to extender plug pin 54-9. Likewise, when shunt 59 is removed, a probe attached to shunt pin 64-sl can send and receive signals through extender plug 54-9 from the corresponding pin in the circuit board socket while being isolated from the corresponding pin in the programmable logic device.

In light of the above explanation, it is easy to see how additional shunts can be provided and used for testing additional internal nodes of the programmable logic device 15 or the system under development 14.

An additional feature sometimes used with this invention is a protection socket into which the header plug or extender plug is inserted. The protection socket includes matching plug pins for insertion into an adjacent socket. The protection socket is less expensive than the header or extender which it protects and can be easily replaced if its plug pins become damaged. The protection socket has the disadvantages of increasing the vertical dimensions of the test equipment and increasing the distance of the programmable logic device from its normal location. Thus use of protection sockets is not always preferred.

With the header and extender assemblies disclosed herein, an emulating programmable logic device is disposed very close to its normal location in the system under development, and thus the lengths of the signal lines or traces added by the header assembly 20 and the extender 40 are relatively short, so that added capacitive and inductive loading is minimal. The emulator probe of this invention accommodates different types of programmable logic device packages to be emulated. Such packages include, for example, a 48 pin DIP, 68 pin PGA or PLCC, or 84 pin PGA or PLCC. The emulator system defined herein allows the use of the programmable logic device type that is to be actually used in the system under development. The emulator probe assembly of this invention uses no more space than the programmable logic device that would normally reside in the socket of the system under development. The small size of the emulator probe assembly allows its use on densely populated boards without experiencing interference with adjacent components. The removable extender allows for use of the header assembly or extender alone in applications where vertical space is limited.

What is claimed is:

1. An emulator probe assembly for coupling a system under development to an emulator comprising:
   a header socket having a plurality of header socket pins;
   a header plug having a corresponding plurality of header plug pins;
   a flexible cable attached at one end to a pod plug and having a plurality of cable lines leading to said pod plug;
   a plurality of direct connect lines connecting from some but not all of said header socket pins to corresponding header plug pins;
   a plurality of first indirect connect lines each connecting from one of said header socket pins not connected to one of said direct connect lines to one of said cable lines leading to said pod plug; and
   a plurality of second indirect connect lines each connecting from one of said header plug pins not connected to one of said direct connect lines to one of said cable lines leading to said pod plug.

2. An emulator probe assembly as in claim 1 further including an extender comprising:
   an extender plug assembly including extender plug pins configured to fit into said header socket;
   an extender socket configured to receive the same size plug as said header socket and including extender socket pins, each of said extender socket pins being electrically connected to a corresponding one of said extender plug pins; and
   test pins located at an accessible perimeter of said extender, each of said test pins being electrically connected to a corresponding one of said extender socket pins.

3. An emulator probe assembly as in claim 2 in which said extender further comprises at least one capacitor between one of said socket pins to which a first supply voltage is applied and another of said socket pins to which a second supply voltage is applied.

4. An emulator probe assembly as in claim 1 further including an extender comprising:
   an extender plug assembly including extender plug pins configured to fit into said header socket;
   an extender socket configured to receive the same size plug as said header socket and including extender socket pins, one of said extender socket pins corresponding to each of said extender plug pins, some of said extender socket pins being electrically connected to a corresponding one of said extender plug pins; each of the remainder of said extender socket pins being electrically connected to a corresponding socket-side shunt pin, said socket-side shunt pin having a corresponding plug-side shunt pin located in a spaced relationship to it and electrically connected to a corresponding one of said extender plug pins;
   removable shunts, each of said removable shunts being locatable to electrically connect one of said socket-side shunt pins to its corresponding plug-side shunt pin, thereby electrically connecting one of said remainder of extender socket pins to its corresponding one of said extender plug pins.

5. An emulator probe assembly as in claim 4 further including a programmable logic device seated in said extender socket, said extender plug assembly being seated in said header socket.

6. An emulator probe assembly as in claim 1 further including an extender comprising:
   an extender plug assembly including extender plug pins configured to fit into said header socket;
   an extender socket configured to receive the same size plug as said header socket and including extender socket pins, some but not all of said extender socket pins being electrically connected to a corresponding one of said extender plug pins;
   test pins located at an accessible perimeter of said extender, each of said test pins being electrically connected to a corresponding one of said extender plug pins; and
   removable shunts, one side of which is electrically connected to one of said extender socket pins not connected to a corresponding one of said extender plug pins, and the other side of which is electrically connected to said corresponding one of said extender plug pins.

7. An emulator probe assembly as in claim 6 further including a programmable logic device seated in said extender socket, said extender plug assembly being seated in said header socket.

8. An emulator probe assembly as in claim 1 further comprising a universal pod enclosing electronic circuitry and having a receptacle for accepting said pod plug, said universal pod having a universal pod cable tied to said electronic circuitry for electrically connecting said universal pod to said emulator.

9. An emulator probe assembly as in claim 8 further comprising said emulator.

10. An emulator probe assembly as in claim 1 further comprising a circuit board into which said header plug is inserted 11. An emulator probe assembly as in claim 10 further comprising a programmable logic device which is inserted into said header socket.

12. An emulator probe assembly as in claim 1 further comprising at least one capacitor connected between one of said direct connect lines to which a first supply voltage is applied and another of said direct connect lines to which a second supply voltage is applied.

* * * * *

UNITED STATES PATENT AND TRADEMARK OFFICE
CERTIFICATE OF CORRECTION

PATENT NO. : 4,853,626

DATED : August 1, 1989

INVENTOR(S) : Edwin W. Resler

It is certified that error appears in the above-identified patent and that said Letters Patent is hereby corrected as shown below:

Title Page:

In the Abstract, line 9, "ccre-" should read --corre---.

In the Abstract, line 22, "for" should read --from--.

Col. 2, line 1, "archival" should read --arrival--.

Col. 8, lines 25 and 34, "64-51 and 64-52" should read --65s1 and 64s2--.

Signed and Sealed this

Twenty-eighth Day of July, 1992

Attest:

DOUGLAS B. COMER

Attesting Officer    Acting Commissioner of Patents and Trademarks